United States Patent
Schweikert et al.

(10) Patent No.: US 10,087,872 B2
(45) Date of Patent: Oct. 2, 2018

(54) SYSTEM AND METHOD FOR A SYNCHRONIZED DRIVER CIRCUIT

(71) Applicant: Infineon Technologies AG, Neubiberg (DE)

(72) Inventors: Christian Schweikert, Munich (DE); Gerhard Pichler, Ferndorf (AT); Marco Nicolo, Munich (DE); Frank Auer, Roehrmoos (DE); Guenther Mohr, Villach (AT); Juergen Schaefer, Gruenwald (DE); Patrick Leteinturier, Riemerling (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 284 days.

(21) Appl. No.: 14/945,087

(22) Filed: Nov. 18, 2015

(65) Prior Publication Data

US 2017/0138292 A1    May 18, 2017

(51) Int. Cl.
| | |
|---|---|
| *H01H 9/00* | (2006.01) |
| *F02D 41/30* | (2006.01) |
| *F02D 41/26* | (2006.01) |
| *F02M 51/06* | (2006.01) |
| *H03K 17/687* | (2006.01) |
| *F02D 41/00* | (2006.01) |
| *F02D 41/20* | (2006.01) |
| *F16C 32/04* | (2006.01) |
| *F02D 41/14* | (2006.01) |

(52) U.S. Cl.
CPC ....... *F02D 41/3005* (2013.01); *F02D 41/009* (2013.01); *F02D 41/20* (2013.01); *F02D 41/26* (2013.01); *F02D 41/266* (2013.01); *F02M 51/061* (2013.01); *H03K 17/687* (2013.01); *F02D 2041/1412* (2013.01); *F16C 32/0446* (2013.01)

(58) Field of Classification Search
USPC .................................................. 361/139, 160
See application file for complete search history.

(56) References Cited

U.S. PATENT DOCUMENTS

| | | |
|---|---|---|
| 6,112,217 A | 8/2000 | Rohm et al. |
| 6,236,554 B1 | 5/2001 | Groppo et al. |
| (Continued) | | |

FOREIGN PATENT DOCUMENTS

DE    19539071 A1    9/1996

OTHER PUBLICATIONS

Leteinturier, P. and Benning, J., "Enhanced Engine Position Acquisition & Treatment," SAE Technical Paper Mar. 1, 1999, 12 Pages.

*Primary Examiner* — Danny Nguyen
(74) *Attorney, Agent, or Firm* — Slater Matsil, LLP

(57) ABSTRACT

According to an embodiment, a controller system that is configured to drive a power switch includes a driver integrated circuit (IC), which includes an interface circuit, a synchronization circuit, and a drive circuit. The interface circuit is configured to receive a control scheme over a serial interface. The synchronization circuit is coupled to the interface circuit and is configured to receive an angular position signal and synchronize a drive signal with the angular position signal, where the drive signal is based on the control scheme. The drive circuit is coupled to the synchronization circuit and is configured to drive the power switch using the drive signal.

41 Claims, 9 Drawing Sheets

(56) References Cited

U.S. PATENT DOCUMENTS

| | | | |
|---|---|---|---|
| 7,035,728 B2 | 4/2006 | Manzone et al. | |
| 7,059,304 B2 | 6/2006 | Manzone et al. | |
| 7,117,852 B2 | 10/2006 | Santero et al. | |
| 7,280,339 B2 | 10/2007 | Manzone et al. | |
| 7,382,065 B2 | 6/2008 | Faggioli et al. | |
| 7,647,919 B2 | 1/2010 | Moller et al. | |
| 2004/0230347 A1* | 11/2004 | Sakurai | F02D 37/02 701/1 |
| 2006/0207564 A1* | 9/2006 | Kinose | F02D 41/20 123/431 |

* cited by examiner

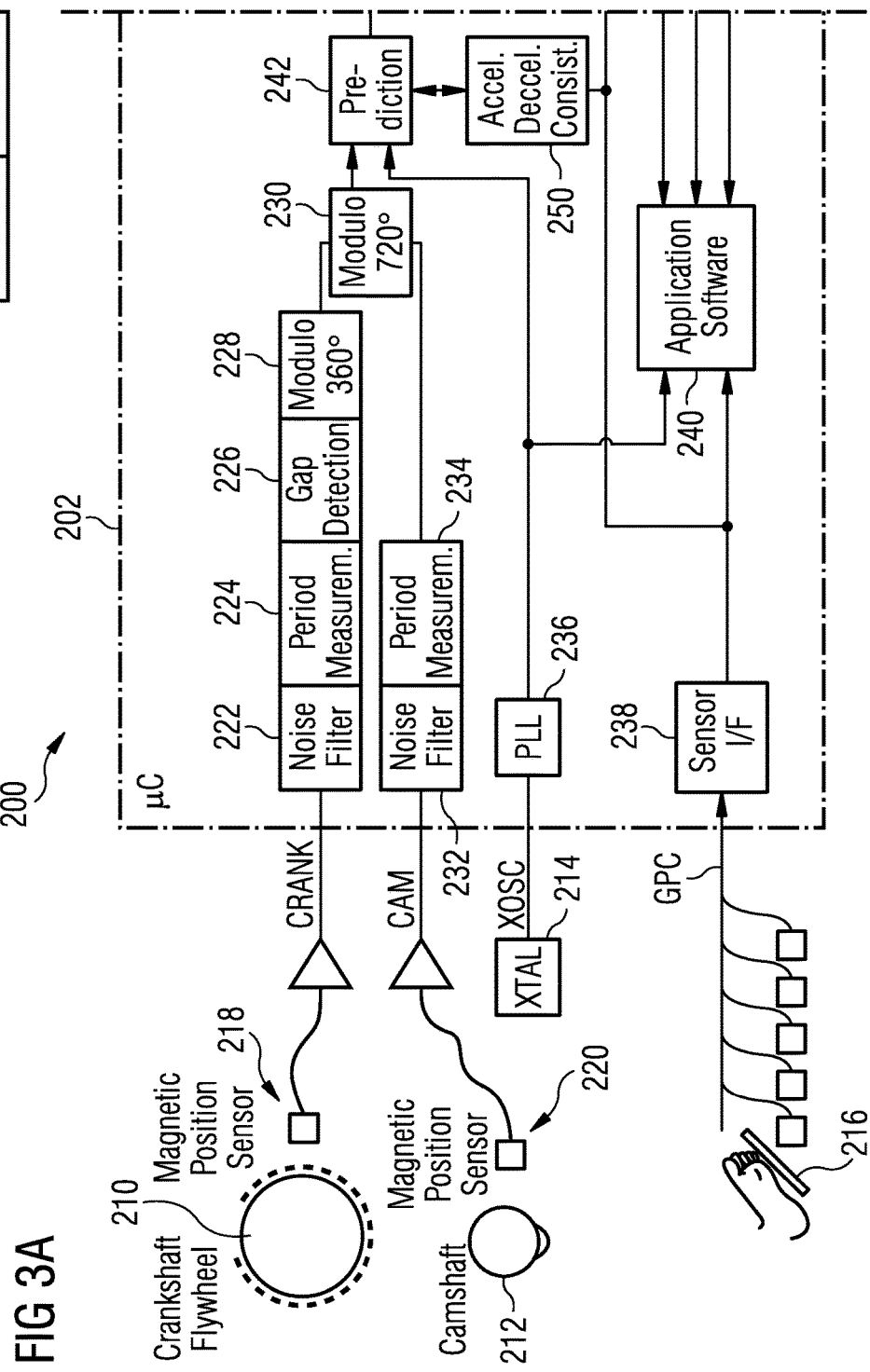

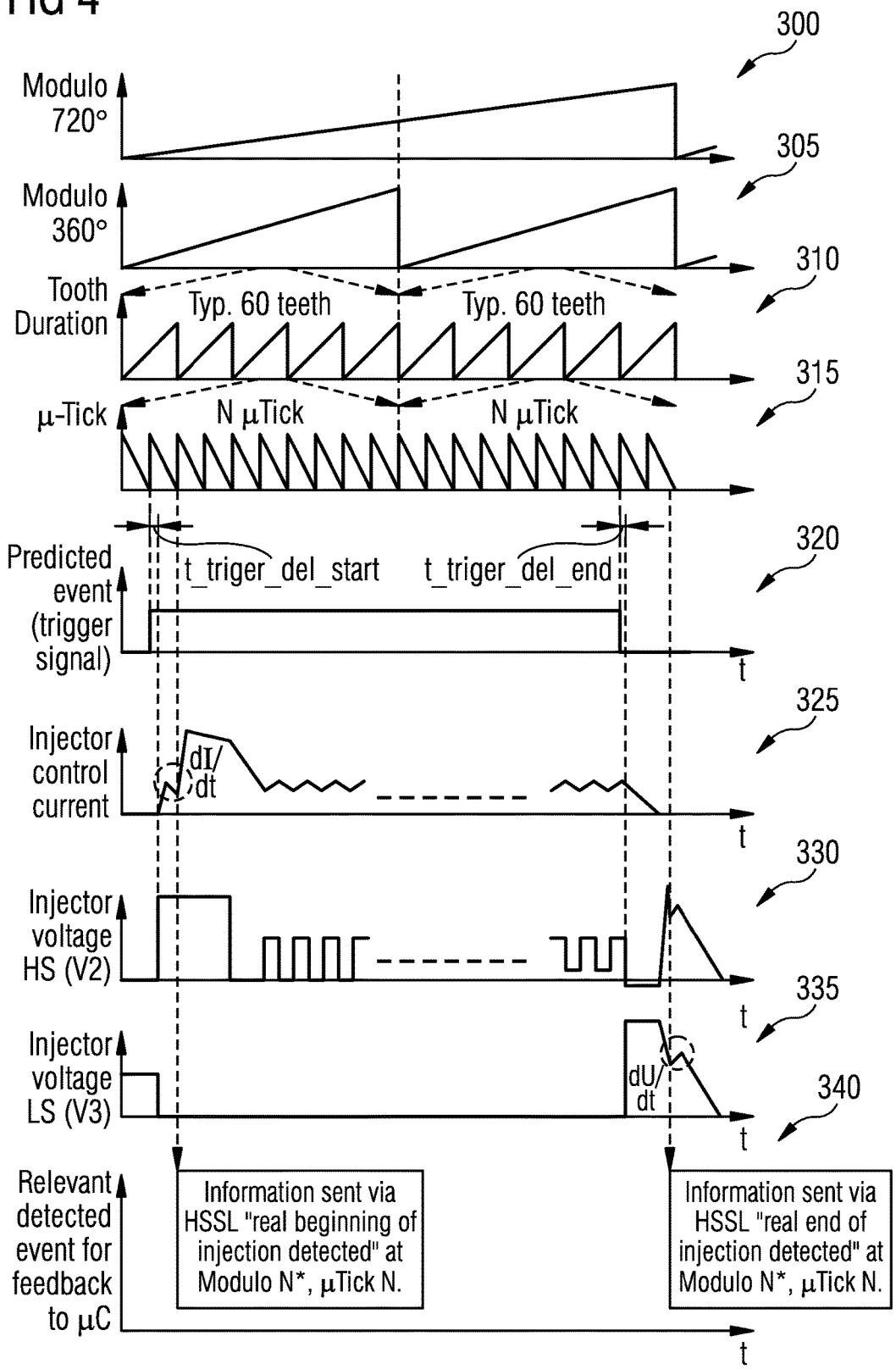

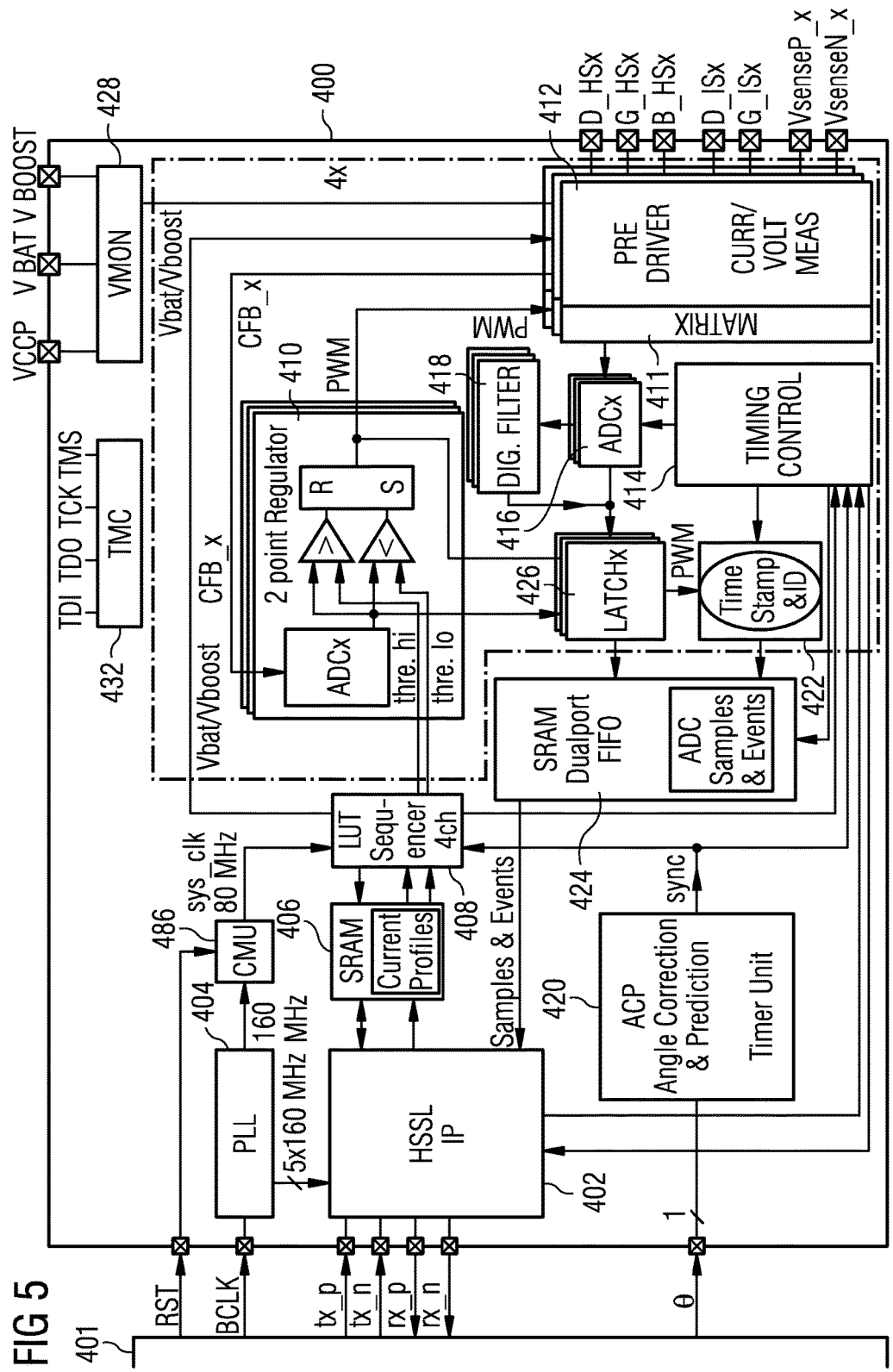

SYSTEM AND METHOD FOR A SYNCHRONIZED DRIVER CIRCUIT

TECHNICAL FIELD

The present invention relates generally to electronic circuits, and, in particular embodiments, to a system and method for a synchronized driver circuit.

BACKGROUND

Driver circuits are electrical circuits used to control another circuit or component, such as a power transistor, a light emitting diode (LED), or numerous other types of electrical components. Driver circuits are usually used to regulate current flowing through a circuit or are used to control other factors for other components or devices connected to the driver circuit. The term "driver circuit" is often used, for example, for a specialized integrated circuit that controls power switches in switched power converters or supplies.

In some instances, driver circuits supply power switches to provide an actuation current for an actuator, such as a solenoid for example. For example, automotive systems, such as vehicle transmissions, fuel injection systems, and combustion engine valve controls generally include solenoids that are actuated to control those systems. In the case of a fuel injection system, a driver circuit actuates solenoids to initiate fuel injections based on driver input and engine operation. Based on the control signals from the driver circuit, the fuel injectors release fuel into the cylinders of the combustion engine.

In various instances, as in the case of automotive systems, the timing control of the driver circuit may be of particular interest. For example, in the case of fuel injectors supplied by power switches driven by a driver IC, the timing of the fuel injections influences the operation of the combustion engine. For this reason, the driver IC is conventionally supplied with specific timing information to properly control the fuel injections in accordance with the demands of the automotive system. Conveying the specific timing information to the driver IC in real-time may present some challenges in an automotive system. Generally, controlling the timing of a driver IC may present some challenges in various systems including a driver IC.

SUMMARY

According to an embodiment, a controller system that is configured to drive a power switch includes a driver integrated circuit (IC), which includes an interface circuit, a synchronization circuit, and a drive circuit. The interface circuit is configured to receive a control scheme over a serial interface. The synchronization circuit is coupled to the interface circuit and is configured to receive an angular position signal and synchronize a drive signal with the angular position signal, where the drive signal is based on the control scheme. The drive circuit is coupled to the synchronization circuit and is configured to drive the power switch using the drive signal.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A and 3B illustrate a system block diagram of an embodiment fuel injection system;

FIG. 4 illustrates waveform diagrams of an embodiment fuel injection system in operation;

FIG. 5 illustrates a schematic diagram of an embodiment driver integrated circuit (IC);

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
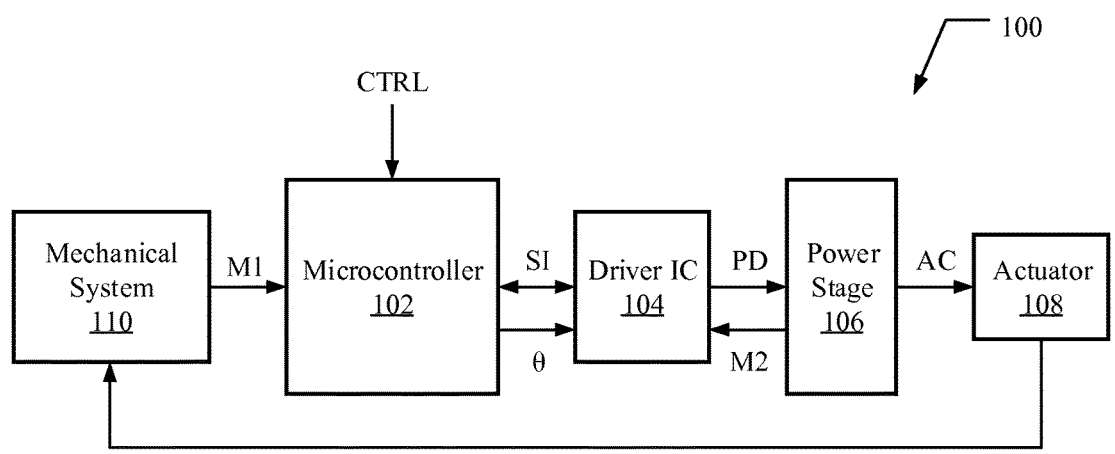
FIG. 1 illustrates a system diagram of an embodiment actuator system.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely driver circuits, and more particularly, synchronized driver circuits for solenoid actuators. Some of the various embodiments described herein include solenoid actuators in automotive systems, control systems for solenoid actuators, fuel injector driver integrated circuits (ICs) for use with direct injection systems, driver ICs for solenoids in automotive systems, and interfaces between a microcontroller and driver IC in an automotive system. In other embodiments, aspects may also be applied to other applications involving any type of driver circuit according to any fashion as known in the art.

As described hereinabove in the background, the timing of control signals provided by a driver IC may be of interest for real-time control systems that drive actuators. According to various embodiments, in order to control timing, a driver IC for controlling an actuator, such as a solenoid actuator, in a mechanical system with a rotational component, such as the crankshaft and the camshaft of a combustion engine, is synchronized with the rotation of the mechanical system by providing an angular position signal to the driver IC. In various such embodiments, a microcontroller provides control information to the driver IC through a high speed serial interface. The control information may be based on numerous characteristics relevant to the particular mechanical system including user input, operating conditions, system design, and performance specifications, for example. In various embodiments, regardless of some of the particulars of the control information, the application of the control information by the driver IC to the actuator is dependent on timing. Thus, the driver IC in such embodiments applies the control signals for driving the actuator based on synchronizing with an input angular position signal. In particular embodiments, the input angular position signal is received from a microcontroller at the driver IC at a single external input pin.

In specific embodiments for a combustion engine, such as in an automotive system, the driver IC actuates fuel injectors based on control information received from a microcontroller. In such embodiments, the driver IC receives an angular position input signal that corresponds to the angular position of the combustion engine within a rotational cycle of the combustion engine. Specifically, the combustion engine may operate with cycles that include 720° of rotation, and, thus, the angular position input signal received at the driver IC indicates the angular position, ranging from 0° to 720°, within the cycle of the combustion engine. In such embodiments, the driver IC actuates the fuel injectors in accordance with the received control information from the microcontroller at precise instances in the combustion engine cycle based on the angular position input signal. Further description is presented hereinafter in reference to particular embodiments in specific contexts, such as automotive systems or combustion engines; however, the various particular embodiments described herein may be applied to the synchronization between a driver IC and any type of power switch or actuator in further embodiments.

FIG. 1 illustrates a system diagram of an embodiment actuator system 100 including microcontroller 102, driver IC 104, power stage 106, and actuator 108. According to various embodiments, microcontroller 102 calculates control information relating to when to activate and deactivate power stage 106 in order to drive actuator 108. The control information is calculated based on specific characteristics and specifications of the system and in response to control signal CTRL and measurement signal M1. In various embodiments, actuator 108 operates to actuate a component in mechanical system 110. Mechanical system 110 includes angular position information. For example, mechanical system 110 may be a combustion engine and control signal CTRL may be a human driver's request for more or less torque. Microcontroller 102 receives measurement signal M1, which includes the angular position information, from mechanical system 110. Using control signal CTRL and measurement signal M1, microcontroller 102 calculates control information and provides the control information to driver IC 104 over serial interface SI.

In various embodiments, driver IC 104 receives angular position signal θ from microcontroller 102 and executes the control information at the precise time indicated by the control information. In such embodiments, angular position signal θ is based on measurement signal M1. Angular position signal θ may be preconditioned in microcontroller 102. In particular embodiments, angular position signal θ is predicted in microcontroller 102. Driver IC 104 generates power drive signal PD with activation and deactivation signals, which are applied during the operation cycle according to the control information and synchronized with angular position signal θ. Thus, driver IC 104 synchronizes with the rotational cycle and applies power drive signal PD by using angular position signal θ.

According to various embodiments, power stage 106 receives power drive signal PD and supplies actuation current AC to actuator 108 based on the power drive signal PD. In various embodiments, actuator 108 is a solenoid actuator that is actuated by actuation current AC. For example, in specific embodiments, actuator 108 is a solenoid actuator in a fuel injector. The fuel injector is triggered to inject fuel based on actuation current AC supplied by power stage 106, which is controlled by driver IC based on control information received from microcontroller 102 and based on angular position signal θ. As shown, actuator 108 may be part of or may be coupled to mechanical system 110 in order to act on mechanical system 110. For example, actuator 108 may control fuel injections when mechanical system 110 is a combustion engine.

In various embodiments, control signal CTRL may include various types of control information. For example, in specific embodiments, control signal CTRL may correspond to a human driver using a gas pedal to initiate acceleration in an automotive system. In such embodiments, measurement signal M1 includes angular position information from the combustion engine that ranges from 0° to 720° for the combustion cycle of the combustion engine. Further description of embodiment systems is provided hereinafter in reference to the other figures.

According to various embodiments, microcontroller 102 is coupled to driver IC 104 through serial interface SI and angular position signal θ. In particular embodiments, serial interface SI is implemented with a high speed serial interface with dedicated external pins for microcontroller 102 and driver IC 104. Similarly, angular position signal θ may be conveyed between microcontroller 102 and driver IC 104 using a single external pin on each of microcontroller 102 and driver IC 104. In particular embodiments, the high speed serial interface may be implemented as a high speed serial link (HSSL). In alternative embodiments, the high speed serial interface may be implemented as a micro second bus (MSB) or serial peripheral interface (SPI).

In various embodiments, power stage 106 may include a power transistor having a breakdown voltage greater than 28V or, specifically, greater than 60V. In particular embodiments, power stage 106 may also include various switching converter or switching supply topologies for providing actuation current AC to actuator 108. In alternative embodiments, power stage 106 may also include normal or low-power transistors having blocking voltages less than 60V, less than 28V, or, specifically, less than 10V. According to various embodiments, driver IC 104 may be configured to generate multiple power drive signals and power stage 106 may include any number of switches or switching converter circuits for driving multiple actuators.

In various embodiments, power stage 106 provides measurement signal M2 to driver IC 104 as a feedback measurement. Measurement signal M2 may include a current measurement from power stage 106 in some embodiments. In some embodiments, measurement signal M2 includes a voltage measurement from power stage 106. In additional embodiments, measurement signal M2 includes a voltage measurement indicating a current value in power stage 106. In some embodiments, measurement signal M2 includes both current and voltage measurements from power stage 106.

According to various embodiments, measurement signal M2 is received at driver IC 104. Based on measurement signal M2, driver IC 104 provides a feedback signal and a corresponding timestamp to microcontroller 102 over serial interface SI.

Figure 2:
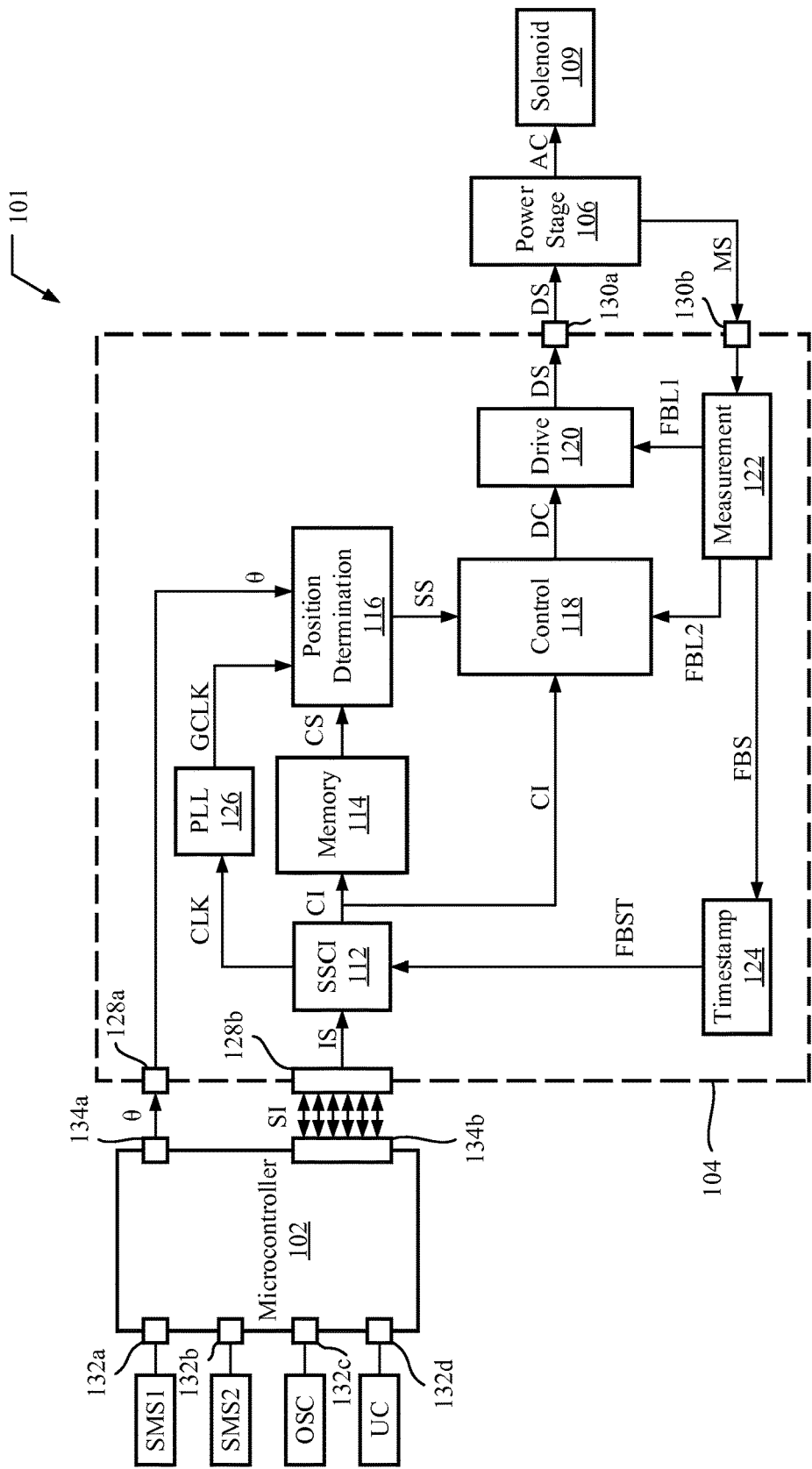
FIG. 2 illustrates a system block diagram of an embodiment solenoid driver system.

FIG. 2 illustrates a system block diagram of an embodiment solenoid driver system 101 including microcontroller 102, driver IC 104, power stage 106, and solenoid 109. According to various embodiments, solenoid driver system 101 may be an embodiment implementation of actuator system 100. Solenoid driver system 101 is described in reference to a particular embodiment for an automotive system with a combustion engine. In other embodiments, solenoid driver system 101 may also be applied to any type of system including a mechanical system with angular position information. In various embodiments, solenoid 109 is one implementation of actuator 108.

According to various embodiments, driver IC 104 includes bidirectional high-speed synchronous serial communication interface (SSCI) circuit 112, memory circuit 114, position determination circuit 116, control circuit 118, drive circuit 120, measurement circuit 122, timestamp circuit 124, and phase locked loop (PLL) circuit 126. Microcontroller 102 provides interface signals IS, including control information CI and clock signal CLK, on the serial interface SI to driver IC 104 and provides angular position signal θ to driver IC 104. Driver IC 104 receives interface signals IS at bidirectional high-speed SSCI circuit 112, which controls the interface protocol for transmitting and receiving using any number of bidirectional high-speed communication protocols, such as a high speed serial link (HSSL), for example. In particular embodiments, external pins 134b and external pins 128b each include dedicated transmitting and receiving pins, a clock pin, and a reset pin. Thus, in some embodiments, bidirectional high-speed SSCI circuit 112 receives clock signal CLK and provides clock signal CLK to PLL circuit 126. Control information CI, from microcontroller 102, is received using the HSSL protocol in some embodiments. In other embodiments, other bidirectional, high-speed, serial, and synchronous protocols may be used. Control information CI is provided to memory circuit 114 and control circuit 118. In such embodiments, the control information may include a control scheme stored in memory circuit 114 as well as current triggering signals, such as turn-on/turn-off signals associated with specific timing for power stage 106, provided to control circuit 118.

In various embodiments, control circuit 118 also receives synchronization signal SS from position determination circuit 116. In such embodiments, position determination circuit 116 receives angular position signal θ from microcontroller 102 and generated clock signal GCLK from PLL circuit 126. Based on angular position signal θ and generated clock signal GCLK, position determination circuit 116 generates synchronization signal SS. Position determination circuit 116 also receives control scheme CS from memory circuit 114. In such embodiments, control scheme CS may include various characteristics relevant to the operation of solenoid driver system 101.

In various embodiments, synchronization signal SS may include an interpolated angular position component with an increased resolution compared to angular position signal θ. For example, angular position signal θ may have a resolution of 6° for a combustion engine and the interpolated angular position component of synchronization signal SS may have a resolution of 0.5° or better. In particular embodiments, the interpolated angular position component of synchronization signal SS may have a resolution of 0.1°. Synchronization signal SS may also include the interpolated angular position component with correction for or prediction of changes in system operation. Specifically, position determination circuit 116 may generate synchronization signal SS with correction and prediction based on control scheme CS received from memory circuit 114. In various embodiments, position determination circuit 116 uses the interpolated angular position component to predict future angular positions. In such embodiments, the interpolated angular position component may be further extrapolated. The prediction of future angular position and control may be based in part on control scheme CS and user control UC received at microcontroller 102, for example. Thus, in various embodiments, synchronization signal SS may include an extrapolated angular position component.

According to various embodiments, control circuit 118 receives synchronization signal SS and control information CI, and, based on these inputs, control circuit 118 generates and provides drive control DC for drive circuit 120. In such embodiments, drive control DC includes drive control signals that are synchronized with the operation of the combustion engine in order to apply activation current AC to solenoid 109 at the appropriate times. Based on drive control DC, drive circuit 120 generates and provides drive signal DS to power stage 106, which in turn drives solenoid 109 using activation current AC.

In various embodiments, measurement circuit 122 receives measurement signal MS, which may be one or multiple current or voltage measurements, from power stage 106. Using measurement signal MS, measurement circuit 122 generates and provides local feedback signal FBL1 for drive circuit 120, local feedback signal FBL2 for control circuit 118, and system feedback signal FBS for timestamp circuit 124. Local feedback signal FBL1 may be used by drive circuit 120 for protection functionality, such as over-current protection, and local feedback signal FBL2 may be used by control circuit 118 for regulation and control functionality, such as current regulation. Timestamp circuit 124 generates a corresponding timestamp for system feedback signal FBS and provides timestamp and system feedback signal FBST to bidirectional high-speed SSCI circuit 112, which then provides the feedback and corresponding timestamp information over serial interface SI to microcontroller 102.

According to various embodiments, solenoid driver system 101 is partitioned into a number of separate components. In specific embodiments, driver IC 104 is a separate semiconductor component with external pin 128a and external pins 128b for interfacing with microcontroller 102 and external pin 130a and external pin 130b for interfacing with power stage 106. Similarly, microcontroller 102 is a separate semiconductor component including external pin 134a and external pins 134b for interfacing with driver IC 104 and external pin 132a, external pin 132b, external pin 132c, and external pin 132d for interfacing with various other system components. In such embodiments, microcontroller 102 and driver IC 104 may be attached to a same printed circuit board (PCB; not shown). In further embodiments, power stage 106 is also a separate semiconductor component, which may be attached to the same PCB or be attached elsewhere in the automotive system. In embodiments where solenoid 109 actuates different mechanical components in a combustion engine, such as a fuel injector or engine valve, solenoid 109 is arranged at the location of the specific component and is not attached to the same PCB.

Figure 8:
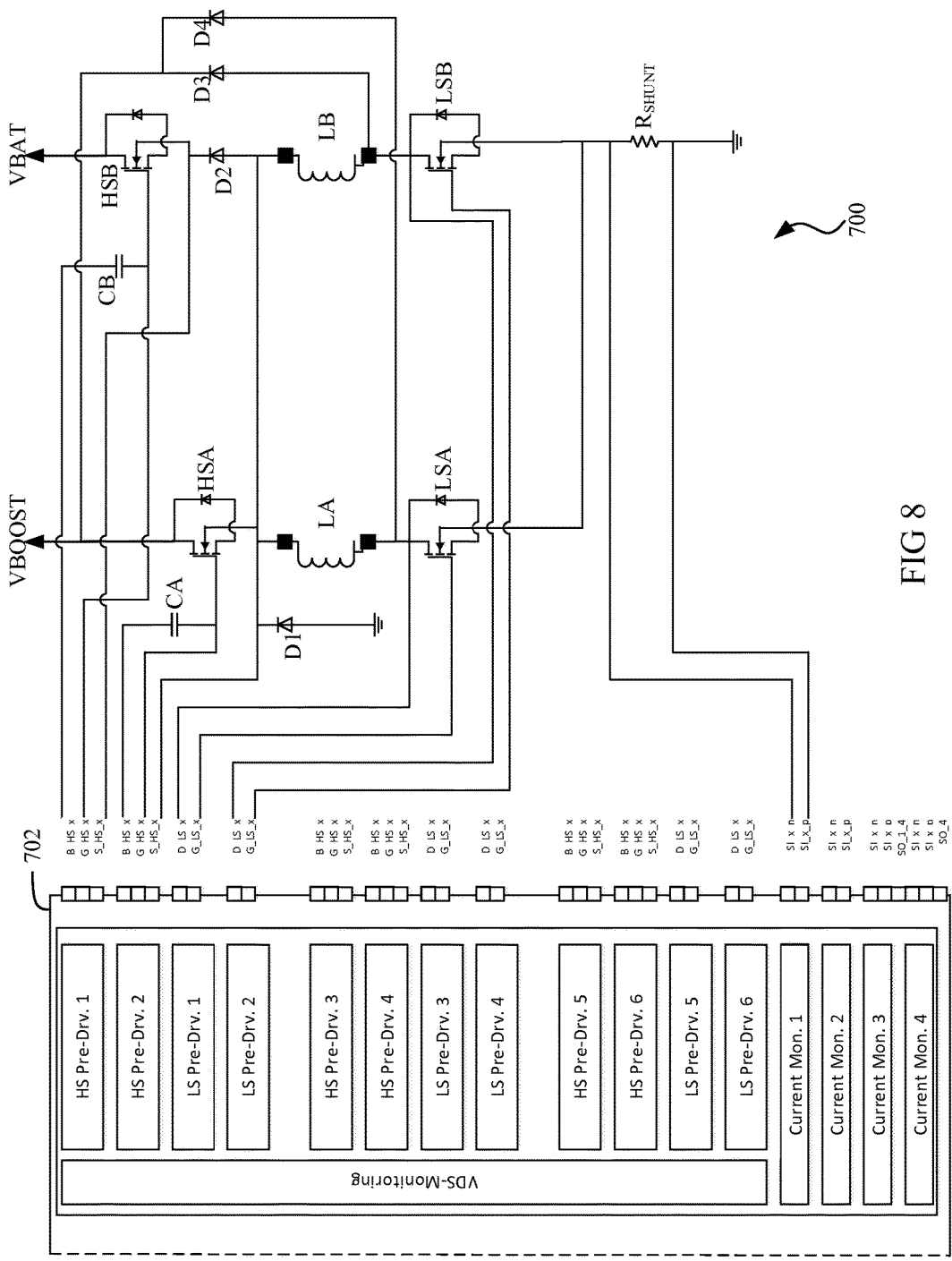
FIG. 8 illustrates a schematic diagram of an example power stage topology.

In various embodiments, solenoid 109 may include any number of solenoids or other actuators for the automotive system. For example, solenoid 109 may include actuators for fuel injectors in each cylinder of the combustion engine, for engine valves in each cylinder of the combustion engine, for high pressure pumps attached to fuel lines, for clutches in automatic transmissions, or for other components. In such embodiments, power stage 106 may include numerous power switches in order to drive each solenoid or other actuator of solenoid 109. In various embodiments, drive circuit 120 and power stage 106 may include various power topologies, with multiple power switch configurations. FIG. 8, described hereinafter, illustrates one example of a power topology. Those having skill in the art will readily appreciate the application of embodiments described herein to various other switching topologies.

According to various embodiments, as described hereinabove, driver IC 104 drives power stage 106 based on control information CI received from microcontroller 102. In such embodiments, microcontroller 102 generates control information CI based on multiple parameters, including, for example, system characteristics and performance specifications, user input control, and sensor information. In various embodiments, control information CI includes a current profile for solenoid 109. The generation of the current profile is performed in application software within microcontroller 102. Each current profile depends specifically on the system in which the current profile is used. For example, in the case of a fuel injector for a combustion engine in an automotive system, the current profile may be calculated based on engine output power, engine structure and characteristics, fuel content, air intake temperature, engine output gas composition, fuel injector characteristics, and other parameters. Some example current profiles for a current injector and electronic clutches are presented in U.S. patent application Ser. No. 14/151,484, filed Jan. 9, 2014, and entitled "Universal Solenoid Driver", which is incorporated herein by reference in its entirety. Those of skill in the art will readily appreciate that the generation of current profiles is known in the art and corresponds closely to the specific application. Therefore, additional description is not included in the interest of brevity.

According to various embodiments, driver IC 104 receives any type of current profile and executes the control of such a current profile in order to drive power stage 106 according to the current profile. In such embodiments, driver IC 104 synchronizes the execution of the current profile using angular position signal θ. In particular embodiments, the precise synchronization is implemented in real-time using position determination circuit 116, which interpolates, corrects, and predicts (such as through extrapolation, for example) the angular position of the machine having the angular position and applies the current profile at precisely synchronized angular positions of the machine.

In various embodiments, a current profile is stored or multiple current profiles are stored in memory circuit 114. In some particular embodiments, memory circuit 114 is a volatile memory, such as an SRAM, that is initialized at startup. For example, in an automotive system, memory circuit 114 may be initialized during a key on sequence. Initialization includes loading a current profile or current profiles into memory circuit 114. Memory circuit 114 may also be updated during operation, such as during every engine cycle. In addition, microcontroller 102 generates additional real-time information that is included in control information CI. In specific embodiments, microcontroller 102 receives sensor measurement signal SMS1 and sensor measurement signal SMS2 at external pin 132a and external pin 132b, respectively, and user control UC at external pin 132d. Microcontroller 102 may also receive feedback and corresponding timestamp information (based on timestamp and system feedback signal FBST) from driver IC 104 as described hereinabove in reference to timestamp circuit 124. Based on the feedback information, user control UC, sensor measurement signal SMS1, and sensor measurement signal SMS2, microcontroller 102 generates specific switch activation and duration information for specific timing of the mechanical system.

In various embodiments, microcontroller 102 may also have multiple additional inputs (not shown) coupled to multiple additional sensors and control inputs. For example, the main air throttle position may be measured and provided to microcontroller 102, as well as global data including air temperature, air mass, oxygen concentration in exhaust, etc. These additional inputs may also be used in determining switch activation and duration information for the specific timing of the mechanical system. Those having skill in the art will readily appreciate the existence and function of these additional signals and inputs used by microcontroller 102 in various embodiments, but excluded from the description herein in the interest of brevity.

The specific switch activation and duration information is included in control information CI, which is provided to driver IC 104. In order to synchronize the specific switch activation and duration information in driver IC 104, the specific switch activation and duration information is provided with corresponding angular position information to driver IC 104. Based on the specific switch activation and duration information and corresponding angular position information, driver IC 104 is able to synchronize the application of the specific switch activation and duration information with angular position signal θ.

In a specific example embodiment, solenoid driver system 101 is included within an automotive system with a combustion engine. The combustion engine operates with combustion cycles including two rotations of the engine crankshaft. In such embodiments, microcontroller 102 receives sensor measurement signal SMS1 and sensor measurement signal SMS2 from a crankshaft sensor and a camshaft sensor, respectively, which provide microcontroller 102 with 720° angular position information corresponding to two full rotations of the engine crankshaft. Further, user control UC corresponds to the actuation of the accelerator, e.g., the gas pedal, by the automotive operator, e.g., the human or autonomous driver. Using the angular position of the engine ranging from 0° to 720° and the requested torque provided by the automotive operator, along with, for example, feedback information from driver IC 104, microcontroller 102 calculates the specific switch activation and duration information for a fuel injector controlled by solenoid 109. In such embodiments, microcontroller 102 also provides angular position signal θ based on sensor measurement signal SMS1 and sensor measurement signal SMS2.

According to various embodiments, microcontroller 102 also performs interpolation of the angular position of the engine as described hereinabove in reference to position determination circuit 116. Specifically, sensor measurement signal SMS1, sensor measurement signal SMS2, and angular position signal θ may each provide a maximum resolution of 6°. For example, the maximum resolution of 6° may be based on the mechanical set-up of a flywheel mounted on a crankshaft and detected by sensor SMS1 (or by sensor 218, described hereinafter in reference to FIG. 3). As similarly described hereinabove in reference to position determination circuit 116, microcontroller 102 may generate the interpolated angular position component with a resolution of 0.5° or better. In particular embodiments, the interpolated angular position component may have a resolution of 0.1°. In such various embodiments, both driver IC 104 and microcontroller 102 perform interpolation of angular position signal θ and use the interpolated angular position for prediction or extrapolation of angular position in order to precisely synchronize the control of solenoid 109 with the angular position of the engine during each two rotation combustion cycle of the engine.

In various embodiments, microcontroller 102 may be coupled to any number of sensors or control inputs. Microcontroller 102 also receives oscillator signal θSC at external pin 132c. Oscillator signal θSC may be provided by an oscillator crystal (not shown), for example.

As described hereinabove, bidirectional high-speed SSCI circuit 112 is coupled to external pins 128b and communicates with microcontroller 102 over serial interface SI using a bidirectional high-speed SSCI communication protocol, such as the HSSL protocol. In alternative embodiments, bidirectional high-speed SSCI circuit 112, and correspondingly microcontroller 102, may implement another type of bus protocol for communication over serial interface SI, such as the micro second bus (MSB) protocol, the serial peripheral interface (SPI) protocol, or other bus protocols. In some specific embodiments, the bus protocol is a high speed bus capable of data rates greater than 1 Mbit/s, such as ranging from 1 Mbit/s to 25 Mbit/sec in some embodiments. Other embodiments may include a bus protocol with still higher data rates above 25 Mbit/s.

According to various embodiments, memory circuit 114 includes a volatile memory. In specific embodiments, memory circuit 114 includes an SRAM circuit lookup table (LUT). In other embodiments, memory circuit 114 may include a non-volatile memory in addition to or in place of the volatile memory. In various embodiments, PLL circuit 126 generates generated clock signal GCLK with a higher frequency than clock signal CLK. For example, clock signal CLK may have a frequency of 20 MHz and generated clock signal GCLK may have a frequency of 120 MHz.

Figure 3B:
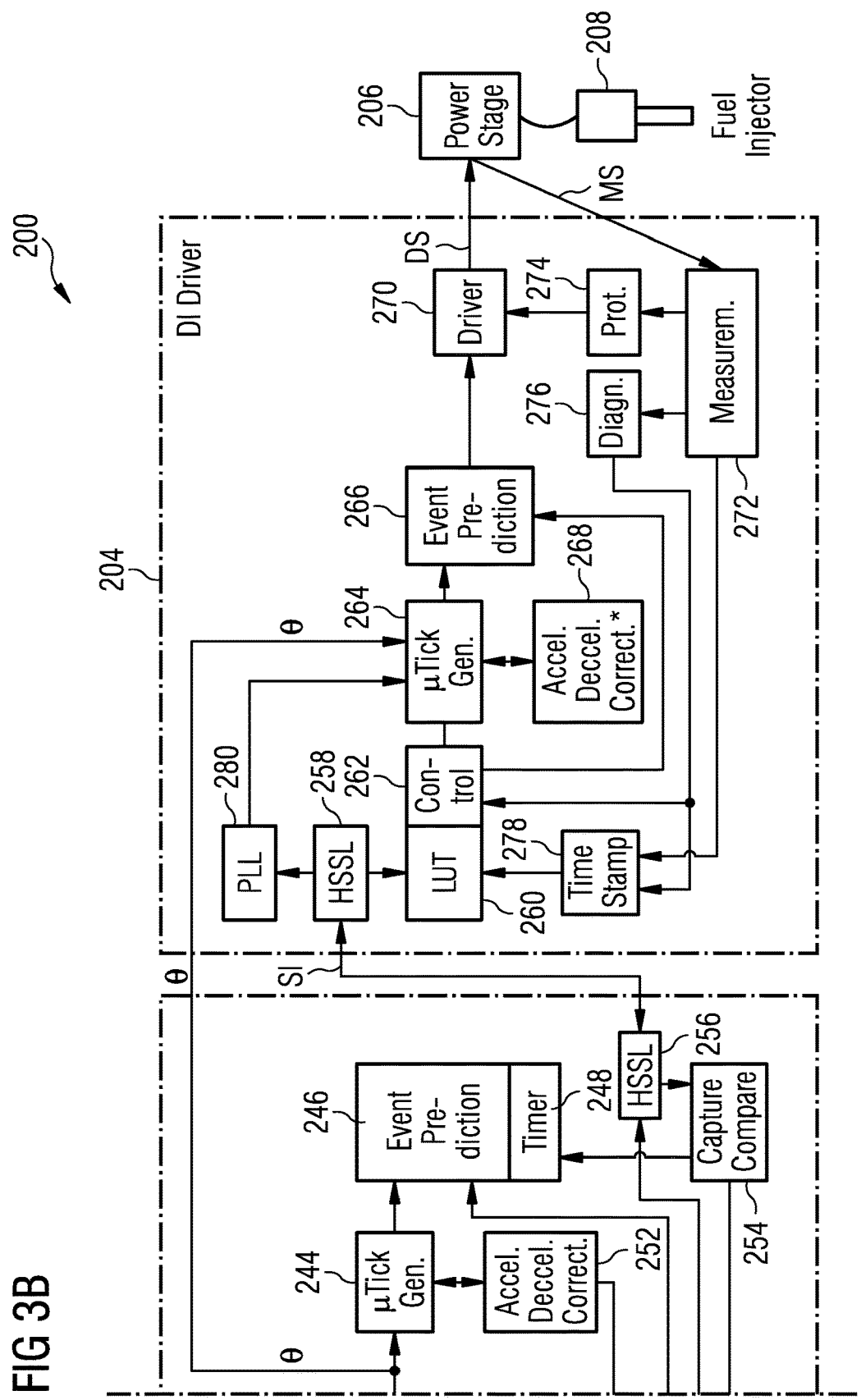

FIG. 3 illustrates a system block diagram of an embodiment fuel injection system 200 including microcontroller 202, driver IC 204, power stage 206, fuel injector 208, crankshaft 210, camshaft 212, crystal oscillator (XTAL) 214, gas pedal 216, magnetic position sensor 218, and magnetic position sensor 220. In order to improve the illustration, FIG. 3 is divided into two figures, FIG. 3A and FIG. 3B, as shown. According to various embodiments, fuel injection system 200 is a specific embodiment implementation of actuator system 100 or solenoid driver system 101 as described hereinabove.

According to various embodiments, microcontroller 202 receives crankshaft angular position signal CRANK from magnetic position sensor 218, which is configured to measure the angular position of crankshaft 210. In some embodiments, magnetic position sensor 218 includes an amplifier as shown. Microcontroller 202 also receives camshaft angular position signal CAM from magnetic position sensor 220, which is configured to measure the angular position of camshaft 212. In some embodiments, magnetic position sensor 220 includes an amplifier as shown. Magnetic position sensor 218 and magnetic position sensor 220 are hall sensors in some embodiments.

In various embodiments, crankshaft 210 and camshaft 212 are part of a combustion engine (not shown). In such embodiments, the combustion engine operates in combustion cycles including two rotations of crankshaft 210. Monitoring of camshaft angular position signal CAM allows identification of the particular rotation in the two rotation cycle of crankshaft 210. Thus, the angular position of crankshaft 210 for each cycle ranges from 0° to 720° and may be determined by monitoring both crankshaft angular position signal CRANK and camshaft angular position signal CAM.

According to various embodiments, microcontroller 202 receives crystal oscillator signal XOSC from XTAL 214. The specific crystal oscillator and the frequency of oscillation may include numerous types of clock signal generators.

In various embodiments, gas pedal 216 provides user input or user control for microcontroller 202. In particular, microcontroller 202 receives gas pedal control signal GPC generated by gas pedal 216. In such embodiments, the user, e.g., a human driver, may press or release gas pedal 216 in order to request more or less torque from the combustion engine. Microcontroller 202 receives gas pedal control signal GPC, which indicates the desired amount of torque. In various alternative embodiments, microcontroller 202 may receive other types of control inputs and gas pedal 216 is one example embodiment. For example, in the case of an autonomous vehicle, gas pedal control signal GPC may be provided from the artificial intelligence (AI) operating the vehicle as a direct control signal to microcontroller 202 without using any gas pedal 216.

Based on the crankshaft angular position signal CRANK, camshaft angular position signal CAM, crystal oscillator signal XOSC, and gas pedal control signal GPC, microcontroller 202 operates to provide control information to driver IC 204 in order to actuate fuel injector 208 through power stage 206. In various embodiments, microcontroller 202 may receive additional control inputs and provide various other control outputs or measurements to further system components (not shown).

According to various embodiments, microcontroller 202 includes multiple sub-components described hereinafter. Primarily components relevant to the control path for fuel injector 208 are shown and described, but microcontroller 202 may include any number of additional functions and equivalent implementation blocks. In various embodiments, noise filter 222 receives crankshaft angular position signal CRANK from magnetic position sensor 218. In such embodiments, noise filter 222 removes noise from crankshaft angular position signal CRANK.

Period measurement circuit 224 receives a filtered version of crankshaft angular position signal CRANK and measures the period of the filtered crankshaft angular position signal CRANK. Following the period measurement, gap detection circuit 226 monitors crankshaft angular position signal CRANK detects a gap that indicates a full rotation of crankshaft 210. In such embodiments, crankshaft 210 may include physical teeth distributed around crankshaft 210 and used by magnetic position sensor 218 to produce crankshaft angular position signal CRANK. The physical teeth may be distributed around crankshaft 210 in order to accommodate 60 teeth, but two of the teeth are removed to form a gap that may be detected in order for each rotation of crankshaft 210 to be detected. Gap detection circuit 226 detects this gap and identifies each rotation of crankshaft 210. In various embodiments, modulo 360° circuit 228 receives crankshaft angular position signal CRANK and identification of the gap from gap detection circuit 226. Based on these signals, modulo 360° circuit 228 generates a version of crankshaft angular position signal CRANK that is modulo 360°, i.e., the signal repeats every rotation of crankshaft 210.

According to various embodiments, noise filter 232 receives camshaft angular position signal CAM from magnetic position sensor 220. In such embodiments, noise filter 232 removes noise from camshaft angular position signal CAM. Period measurement circuit 234 receives a filtered version of camshaft angular position signal CAM and measures the period of the filtered camshaft angular position signal CAM. Generally, crankshaft 210 and camshaft 212 are mechanically coupled together such that camshaft 212 rotates once for every two rotations of crankshaft 210. For example, crankshaft 210 and camshaft 212 may be mechanically coupled together through a chain. In various embodiments, camshaft 212 includes a single tooth that is detected by magnetic position sensor 220 once every rotation.

According to various embodiments, modulo 720° circuit 230 receives the version of crankshaft angular position signal CRANK that is modulo 360° and the filtered and measured version of camshaft angular position signal CAM. Based on these inputs, modulo 720° circuit 230 generates an angular position signal that is modulo 720° and indicates the position of crankshaft 210 within each two rotation cycle.

In various embodiments, PLL circuit 236 receives crystal oscillator signal XOSC from XTAL 214 and provides an internal clock signal to prediction circuit 242 and application software 240. In particular embodiments, application software 240 may be run on the core of microcontroller 202 and PLL circuit 236 provides the internal clock signal to the core and to all the other components within microcontroller 202. Prediction circuit 242 receives the internal clock signal from PLL circuit 236 and the angular position signal that is modulo 720° from modulo 720° circuit 230. Based on these signals, prediction circuit 242 has the angular position modulo 720° and the time period for each tooth on crankshaft 210. In order to control the combustion engine, fuel injection system 200 controls the timing of injections by fuel injector 208 very precisely. In such embodiments, the angular position modulo 720° available at prediction circuit 242 may not be precise enough to control fuel injector 208 properly because acceleration and deceleration changes the angular position and the rate of change of the combustion engine, leading to a decrease in the accuracy of the angular position modulo 720° provided to prediction circuit 242. In such embodiments, prediction circuit 242 communicates with acceleration/deceleration consistency circuit 250, which is supplied with an input from sensor interface circuit 238, in order to predict the effects of acceleration or deceleration on the angular position modulo 720°. Prediction circuit 242 generates a predicted angular position modulo 720°, which maintains consistency between the angular position and the time period corresponding to each tooth on crankshaft 210 through communication with acceleration/deceleration consistency circuit 250. The predicted angular position modulo 720° is provided to microtick generator circuit 244.

In various embodiments, the predicted angular position modulo 720° that is provided to microtick generator circuit 244 is also provided to microtick generator circuit 264 in driver IC 204 as angular position signal θ. As described hereinabove, each tooth on crankshaft 210 may be separated by 6°, which leads to angular position signal θ at microtick generator circuit 244 having a resolution of 6°. In various embodiments, in order to precisely control fuel injector 208, a higher resolution angular position signal is necessary. In such embodiments, microtick generator circuit 244 (as well as microtick generator circuit 264) generates an interpolated angular position signal having a resolution of 0.5° or better. In particular embodiments, the interpolated angular position signal generated by microtick generator circuit 244 has a resolution of 0.1° or better. In order to generate the interpolated angular position signal with high resolution, microtick generator circuit 244 communicates with acceleration/deceleration correction circuit 252 to correct for acceleration and deceleration of the combustion engine. In various embodiments, microtick generator circuit 244 may be implemented as a digital PLL circuit.

According to various embodiments, the corrected and predicted interpolated angular position signal with high resolution is provided to event prediction circuit 246, which also receives injection control timing information from application software 240. Using injection control timing information from application software 240 and the corrected and predicted interpolated angular position signal from microtick generator circuit 244, event prediction circuit 246 and timer 248 together predict the angular positions along with the upcoming fuel injection events and provide the specific angular position information back to application software 240 or additional driver ICs (not shown) that perform other functions.

In various embodiments, HSSL interface circuit 256 in microcontroller 202 communicates with HSSL interface circuit 258 in driver IC 204. In such embodiments, serial interface SI is an HSSL, and HSSL interface circuit 256 communicates over serial interface SI with HSSL interface circuit 258. In various embodiments, serial interface SI is another type of bidirectional high-speed SSCI and HSSL interface circuit 256 and HSSL interface circuit 258 are corresponding interface circuits for the particular interface bus. In alternative embodiments, serial interface SI is another type of interface bus, such as an MSB or SPI, and HSSL interface circuit 256 and HSSL interface circuit 258 are corresponding interface circuits for the particular interface bus.

In various embodiments, the generation of the corrected and predicted interpolated angular position signal in reference to microcontroller 202 is described in further detail in SAE Technical Paper 1999-01-0203 by Patrick Leteinturier and Joseph Benning and entitled "Enhanced Engine Position Acquisition & Treatment" (Leteinturier and Benning) which is incorporated herein by reference in its entirety. Further, the generation of the corrected and predicted interpolated angular position signal is repeated in driver IC 204 by microtick generator circuit 264, acceleration/deceleration correction circuit 268, and event prediction circuit 266.

In various embodiments, application software 240 receives user control information from sensor interface circuit 238, which receives gas pedal control signal GPC from gas pedal 216. Application software 240 also receives the internal clock signal from PLL circuit 236, feedback information from driver IC 204 through HSSL interface circuit 256, and feedback comparison information from capture and compare circuit 254. Based on the received inputs and feedback information, application software 240 calculates a trigger envelope including injection control timing with a start injection time and a stop injection time that are both synchronized with a specific angular position of the combustion engine. Further, in some embodiments during an initialization or startup phase, application software 240 may provide a current profile or current profiles through HSSL interface circuit 256 to be stored in lookup table (LUT) 260 in driver IC 204. For example, the initialization or startup phase may be a key on startup in an automotive system.

According to various embodiments, LUT 260 stores a current profile or multiple current profiles for controlling fuel injector 208. In various embodiments, LUT 260 may include a volatile memory, such as an SRAM, for storing current profiles and information communicated over serial interface SI in real-time during operation. In alternative embodiments, LUT 260 may include a non-volatile memory in addition to or in place of the volatile memory. LUT 260 communicates over serial interface SI through HSSL interface circuit 258 and is controlled by control circuit 262. HSSL interface circuit 258 also receives a transmitted clock signal, which it supplies to PLL circuit 280 in order to generate an internal driver clock signal.

According to various embodiments, microtick generator circuit 264 (which receives the internal driver clock and angular position signal θ), acceleration/deceleration correction circuit 268, and event prediction circuit 266 operate as similarly described hereinabove in reference to microtick generator circuit 244, acceleration/deceleration correction circuit 252, and event prediction circuit 246 and in further detail in Leteinturier and Benning In particular embodiments, event prediction 246 does send information across serial interface SI. Specifically, both event prediction circuit 246 and event prediction circuit 266 may separately generate precise angular position information. Event prediction circuit 266 may precisely determine the timing and corresponding angular position for each fuel injection in accordance with control information in LUT 260 and from control circuit 262.

In various embodiments, LUT 260 and control circuit 262 receive the trigger envelope (which includes injection control timing with a start injection time and a stop injection time that are both re-synchronized with a specific angular position of the combustion engine) from application software 240 via serial interface SI and the respective HSSL interface circuits (256 and 258). Event prediction circuit 266 receives, from LUT 260 and control circuit 262, the trigger envelope generated by application software 240. Based on the trigger envelope, the stored current profile, and the corrected and predicted interpolated angular position signal, event prediction circuit 266 supplies switching control signals to driver circuit 270. Based on the switching control signals, driver circuit 270 controls power stage 206 to actuate fuel injector 208 in order to precisely control fuel injections in a cylinder of the combustion engine.

According to various embodiments, measurement circuit 272 receives voltage or current measurement signals MS from power stage 206. In such embodiments, measurement circuit 272 provides, through protection circuit 274, over-voltage or over-current protection signals to driver circuit 270 that disable or limit driver circuit 270 in the case of a detected over-voltage or over-current condition. Further, measurement circuit 272 and diagnostic circuit 276 provide voltage or current measurement signals MS and diagnostic information, respectively, to timestamp circuit 278, which adds corresponding timestamp information to voltage or current measurement signals MS and the diagnostic information before providing it back to microcontroller 202 over serial interface SI.

Application software 240 receives voltage or current measurement signals MS and the diagnostic information with the corresponding timestamp as control feedback. In such embodiments, capture and compare circuit 254 also receives voltage or current measurement signals MS in order to perform a comparison to expected values. The result of the comparison is also provided to application software 240 as comparison feedback. Based on the received comparison and control feedback, application software 240 may modify the trigger envelope for upcoming fuel injections in order to, for example, correct for detected mismatch between the trigger envelope and the detected real opening and closing of fuel injector 208 measured by measurement circuit 272 and analyzed by capture and compare circuit 254.

FIG. 4 illustrates waveform diagrams 300-340 of an embodiment fuel injection system in operation. According to an embodiment, waveform diagrams 300-340 illustrate the operation of fuel injection system 200 in reference to the operation of microcontroller 202 and application software 240 and driver IC 204. In such embodiments, waveform diagram 300 depicts the predicted angular position modulo 720° that is provided to microtick generator circuit 244 and microtick generator circuit 264. Waveform diagram 305 depicts the angular position modulo 360° provided from modulo 360° circuit 228. Waveform diagram 310 depicts output of magnetic position sensor 218, such as after filtering in noise filter 222 and period measurement circuit 224, which corresponds to the signal for each tooth on crankshaft 210. Waveform diagram 315 depicts the microtick signal generated by both microtick generator circuit 244 and microtick generator circuit 264. The microtick signal indicates the interpolated angular position of the combustion engine.

According to various embodiments, application software 240 generates a trigger envelope, which includes injection control timing with a start injection time and a stop injection time that are both synchronized with a specific angular position of the combustion engine. The trigger envelope is provided to driver IC 204. Using the trigger envelope, driver IC 204 calculates a local trigger signal with stop and start times for a fuel injection. Waveform diagram 320 depicts the local trigger signal. In such embodiments, driver IC 204 uses a current profile, as depicted in waveform diagram 325, to control the current supplied to fuel injector 208 by power stage 206. The current profile is applied starting with a start trigger of the local trigger signal and is ended with an end trigger of the local trigger signal depicted in waveform diagram 320. For example the start trigger is the rising edge and the end trigger is the falling edge of the local trigger signal.

As shown, the current profile depicted in waveform diagram 325 may range in intended current application. In such embodiments, power stage 206 is controlled by driver circuit 270 in order to provide, or closely approximate, the current profile used by fuel injection system 200. In order to provide the intended current profile, driver circuit 270 provides a high side (HS) injector drive signal as depicted in waveform diagram 330 and a low side (LS) injector drive signal as depicted in waveform diagram 335. In various embodiments, power stage 206 includes high side and low side switches receiving the HS injector drive signal and the LS injector drive signal depicted in waveform diagram 330 and waveform diagram 335, respectively.

In various embodiments, waveform diagram 330 and waveform diagram 335 include, on the one hand, the voltage information caused by the switching pattern of the HS and LS switches and, on the other hand, the feedback of the solenoid actuator in the fuel injector. This back EMF signal contains the information of when the plunger of the solenoid opens and closes, which indicates the real beginning and the real ending of the fuel flow through the fuel injector into the combustion chamber. In such embodiments, the back EMF signal is indirectly measured by the measurement circuit 272. Because there may be unpredictable delays between the control signal in waveform diagram 320 and the real opening and closing of the solenoid in the fuel injector, a mismatch between the predicted and delivered fuel quantity may occur. In such embodiments, these mismatch errors are corrected within the next injection cycle. The measurement information, which is used to determine the mismatch error, from measurement circuit 272 is directly related to the control signal of waveform diagram 320, which has been locally re-built (or determined) in drive IC 204 is provided with a timestamp at timestamp circuit 278 and supplied to microcontroller 202, where the calculation of the correction for the mismatch error for the next cycle is performed in application software 240.

According to such various embodiments, measurement circuit 272 and timestamp circuit 278 generate feedback information that is provided to microcontroller 202 via serial interface SI. For example, the specific timing information and corresponding angular position of the real injection start and the real injection end is provided as feedback. As shown by waveform diagram 320 and waveform diagrams 325 and 330, there is a delay, e.g., a delta time or delta angle, between the initiation of the local trigger signal (in waveform diagram 320) and the switching on of HS injector drive signal (in waveform diagram 325) corresponding to the beginning of current injection at fuel injector 208 (in waveform diagram 330). Thus, waveform diagram 340 depicts the feedback information with the timing and angle of the real start and the real end of current injection, which corresponds to the real start and the real end of fuel injection in specific embodiments.

As described hereinabove in reference to the other figures, the specific current profile depends on multiple factors. Further, the switching signals in order to provide a specific current profile depend on the power stage topology and components used in order to provide the current profile. Those of skill in the art will readily appreciate the necessary steps and modifications to implement various current profiles for numerous mechanical systems with angular position information and to implement the switching signals for various specific power stage topologies. According to various embodiments, the synchronization of a microcontroller with a driver IC for a mechanical system with angular position information is performed using the angular position information. Such embodiments may be implemented with any type of current profile for any type of power stage that drives the mechanical system with angular position information.

FIG. 5 illustrates a schematic diagram of an embodiment driver integrated circuit (IC) 400 coupled to microcontroller 401 through serial interface SI and angular position signal θ. According to various embodiments, driver IC 400 may be an embodiment implementation of driver IC 104 or driver IC 204, as described hereinabove in reference to the other figures. In specific embodiments, serial interface SI is implemented as an HSSL bus that includes bus clock BCLK, transmitting lines tx_p and tx_n, and receiving lines rx_p and rx_n. Microcontroller 401 may also supply driver IC 400 with reset signal RST. In such embodiments, both microcontroller 401 and driver IC 400 include dedicated external pins for each of signal RST, bus clock BCLK, transmitting lines tx_p and tx_n (two pins), receiving lines rx_p and rx_n (two pins), and angular position signal θ.

According to various embodiments, driver IC 400 operates with a main control path from microcontroller 401 to analog pre-driver circuit 412 through HSSL interface protocol (IP) circuit 402, SRAM circuit 406, LUT sequencer 408, and regulator circuit 410. Driver IC 400 also operates with a diagnostic return path from analog pre-driver circuit 412 to microcontroller 401 through diagnostic elements including timing control circuit 414, analog to digital converter (ADC) circuit 416, digital filter circuit 418, latch circuit 426, timestamp and identification (ID) circuit 422, and SRAM first-in-first-out (FIFO) circuit 424.

According to various embodiments, driver IC 400 is coupled to multiple channels, such as for multiple solenoids. In a particular embodiment, driver IC 400 generates switching control signals for four parallel channels that drive four solenoids. In various embodiments, the main control path and the diagnostic return path are executed once per channel. For a driver IC with four parallel operating channels, each channel can be mapped to selectable drivers through programmable switching-matrix 411. In various embodiments, driver IC 400 may drive multiple switching power stages using multiple parallel operating channels. In such embodiments, elements such as regulator circuit 410, analog pre-driver circuit 412, digital filter circuit 418, ADC circuit 416, timing control circuit 414, timestamp and ID circuit 422, and latch circuit 426 may include multiple instances, with one instance per power stage and operating channel. For example, three, four, or six operating channels may be used in various implementations.

In various embodiments, programmable switching-matrix 411 is a separate unit from analog pre-driver circuit 412, and is connected to one or more instances, such as four, for example, of analog pre-driver circuit 412. Similarly, one or more instances of regulator circuit 410 may be assigned to different operating channels through programmable switching-matrix 411 to one or more analog pre-driver circuits 412. In such embodiments, the arrangement enables higher flexibility for driving different power configurations.

In various embodiments, HSSL IP circuit 402 supports a first streaming channel for high-speed uploading of diagnosis data to microcontroller 401 and a second lower-speed channel for downloading the current profiles into the sequencer's look-up-table (LUT sequencer 408) for controlling regulator circuit 410. LUT sequencer 408 is programmable by microcontroller 401 and may be programmed with various elements including time occurrence (timestamp), current value and channel number of regulator circuit 410, and defined events. In such embodiments, LUT sequencer 408 may store these elements in a volatile look-up-table. Further, LUT sequencer 408 processes these elements for each channel to control regulator circuit 410.

According to various embodiments, regulator circuit 410 is a 2-point hysteretic regulation circuit implemented by tuning the thresholds thre_hi and thre_lo of a digital comparator included in regulator circuit 410. For each channel, input to regulator circuit 410 is a digital representation of analog current feedback signal CFB_x for the power switches of the respective channel. Output of regulator circuit 410 is the pulse-width-modulated (PWM) control signal, controlling the on/off state of the same driving switch of each respective channel.

According to various embodiments, angle correction and prediction (ACP) circuit 420 calculates the high resolution, such as through interpolation, angular position signal based on angular position signal θ. Angular position signal θ is the relevant input signal coming directly from the sensor of the crank shaft or from microcontroller 401 as described hereinabove in reference to FIG. 3. The high resolution angular position signal generated by ACP circuit 420 is used for precise synchronization of the entire system according to the angle information. In such embodiments, ACP circuit 420 includes a high resolution timer unit within the block.

In various embodiments, clock management unit (CMU) circuit 430 includes system reset and clock functions. CMU circuit 430 receives a higher frequency internal clock signal, having a frequency of 160 MHz, for example, from PLL circuit 404 and reset signal RST from microcontroller 401 and generates sys_clk, having a frequency of 80 MHz, for example. In specific embodiments, test mode controller (TMC) circuit 432 initiates tests and is programmed from external devices via a JTAG interface with I/O ports TDI, TDO, TCK, and TMS. In further specific embodiments, voltage monitoring unit (VMON) circuit 428 monitors supply voltages, such as VCCP and battery voltage VBAT, for example, and boost voltages, such as boost voltage VBOOST, for example, for driver IC 400.

According to various embodiments, analog pre-driver circuit 412 provides the driving signals for the power switches. In such embodiments, the analog pre-driver circuit 412 provides signals with reference to the battery voltage, the boost voltage, or ground. The output terminals (external pins) of analog pre-driver circuit 412 are connected directly to the external power switches of the power stage. Specifically, external pins D_HSx, G_HSx, and B_HSx are coupled to the HS power switch for each respective channel and external pins D_LSx and G_LSx are coupled to the LS power switch for each respective channel. In various embodiments, current through the power switches can be measured by detecting voltage drops on the low-impedance serial shunt resistors. Measurements are performed by analog pre-driver circuit 412 through external pins VsenseP_x and VsenseN_x.

According to various embodiments, diagnostic elements including timing control circuit 414, analog to digital converter (ADC) circuit 416, digital filter circuit 418, latch circuit 426, timestamp and ID circuit 422, and SRAM first-in-first-out (FIFO) circuit 424. In such embodiments, voltages and currents from analog pre-driver circuit 412 are converted into digital values by ADC circuit 416. The converted digital signals may be filtered by digital filter circuit 418 in the signal path. In some embodiments, raw data and also filtered data are sent to microcontroller 401. The data acquisition for diagnosis may be activated during periodic measurement intervals. In specific embodiments, the timing of the data acquisition is programmable by microcontroller 401 and synchronized to the high resolution angular position provided by ACP circuit 420. In various embodiments, the digital samples from the measurement block are combined with timestamps and channel IDs at timestamp and ID circuit 422. In such embodiments, the digital samples keep the reference information after the transmission into the memory in microcontroller 401 by SRAM FIFO circuit 424 and HSSL IP circuit 402.

In various embodiments, the number of channels, and corresponding power switches, coupled to driver IC 400 may vary. For example, driver IC may be coupled to 1, 2, 3, or 4 separate switching power stages. In various embodiments, the signals of driver IC 400 depicted in FIG. 5 that end with the character 'x' will be repeated for each channel. Thus, for driver IC 400 driving four channels, the signals will include four instances '1', '2', '3', and '4', one for each channel.

Figure 6:
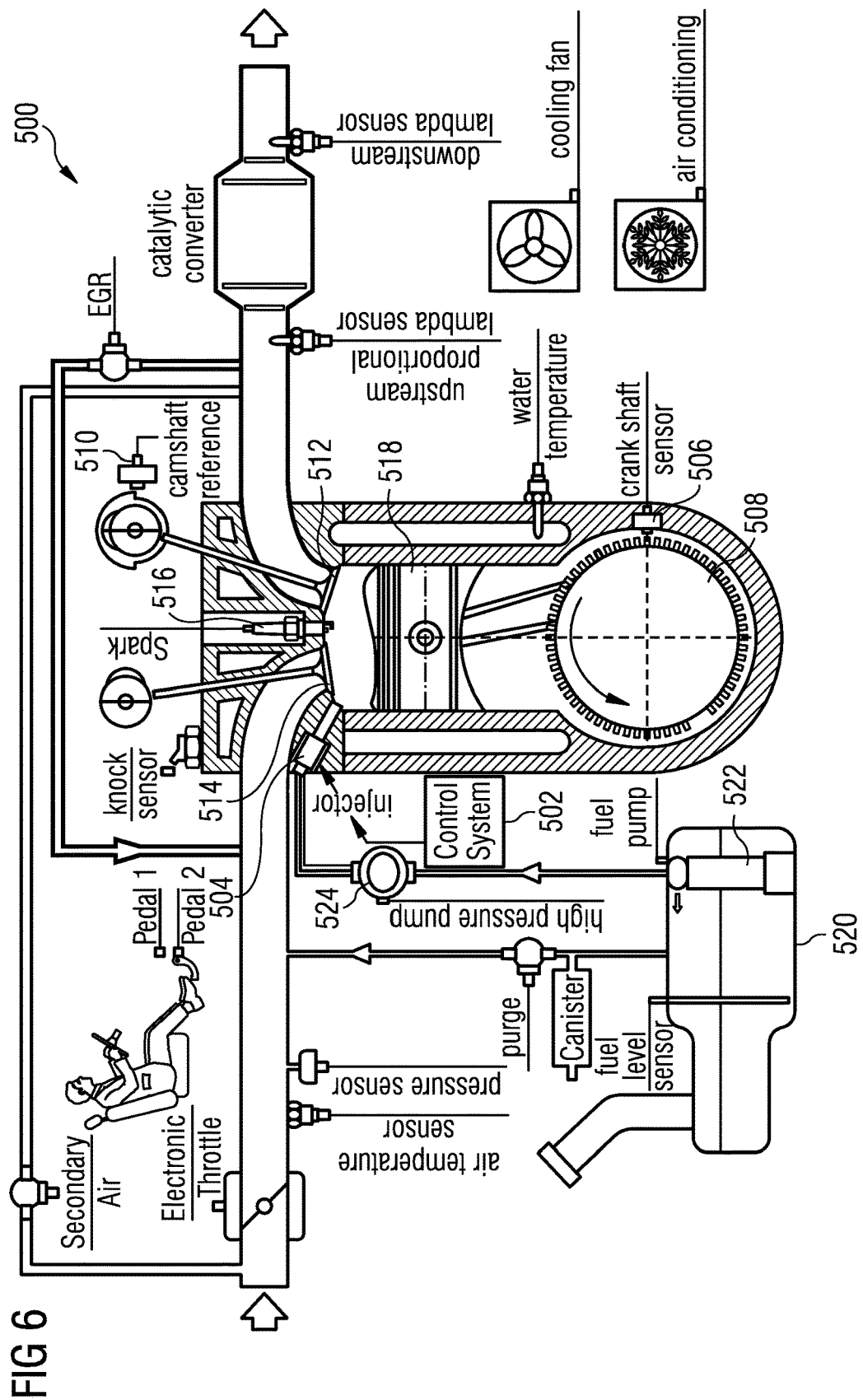
FIG. 6 illustrates a functional schematic of an embodiment combustion engine.

FIG. 6 illustrates a functional schematic of an embodiment combustion engine 500 including controller system 502 for fuel injector 504. Various elements are included in FIG. 6 for illustrated purposes, but are undescribed in the interest of brevity. According to various embodiments, controller system 502 includes a microcontroller, a driver IC, and a power stage for controlling fuel injector 504, as described hereinabove in reference to the other figures. Controller system 502 determines fuel injection for combustion engine 500 and actuates fuel injector 504 accordingly.

In various embodiments, crankshaft sensor 506 senses the angular position of crankshaft 508 and may provide the angular position to controller system 502. Similarly, camshaft reference 510 detects which cycle of a two rotation (720°) cycle the camshaft is in based on the opening and closing of output valve 512 (or intake valve 514). As fuel and air are allowed into the combustion chamber above piston 518, sparkplug 516 initiates the explosion that drives piston 518 and continues to rotate crankshaft 508.

In such embodiments, fuel pump 522 provides fuel from fuel tank 520 to fuel injector 504. In some embodiments, high pressure pump 524 maintains a stable pressure fuel supply to fuel injector 504 during operation.

According to various embodiments, controller system 502 provides control signals to fuel injector 504 synchronous with the position of piston 518 and the angular position of crankshaft 508. In other embodiments, controller system 502 may control numerous other actuators synchronous with the position of piston 518 and the angular position of crankshaft 508. For example, controller system 502 may control output valve 512, intake valve 514, or high pressure pump 524. In a still further embodiment, controller system 502 may be used to control clutches in a transmission synchronous with the position of piston 518 and the angular position of crankshaft 508.

Figure 7:
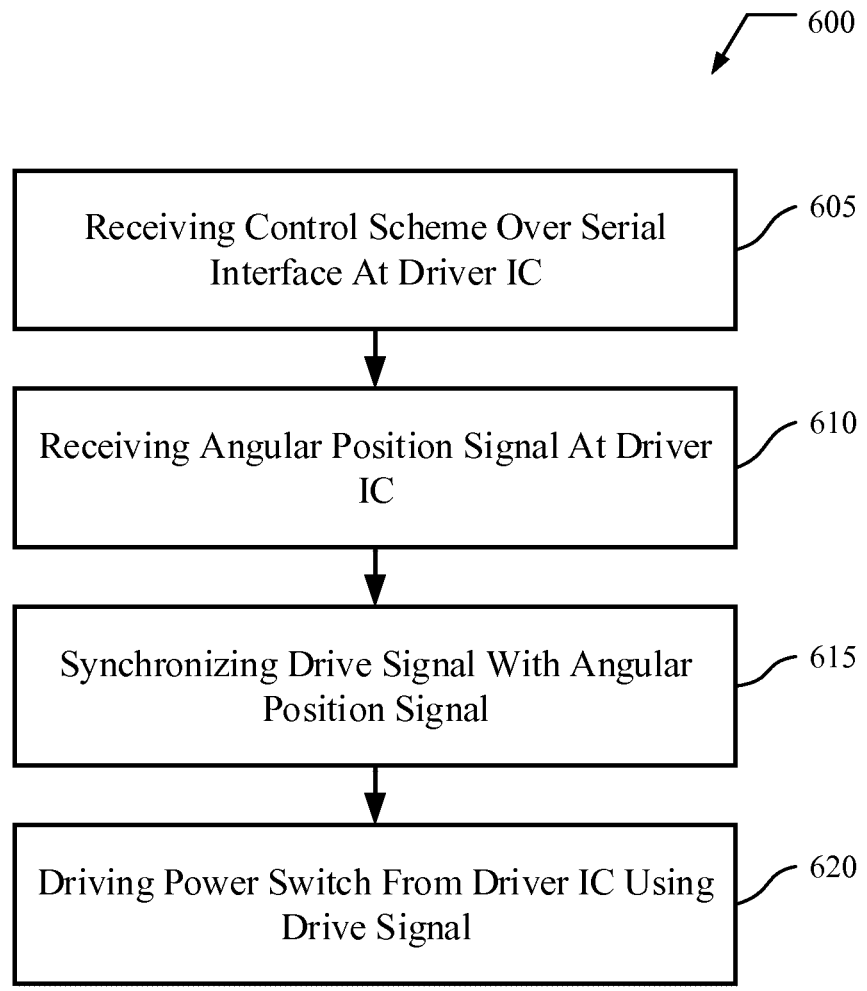
FIG. 7 illustrates a block diagram of a method of operating an embodiment controller system.

FIG. 7 illustrates a block diagram of method 600 of operating an embodiment controller system. According to various embodiments, method 600 includes steps 605, 610, 615, and 620. In various embodiments, step 605 includes receiving a control scheme over a serial interface at a driver IC. The control scheme may include both control information, such as a trigger envelope, and a current profile. In particular embodiments, current profiles are received separately during an initialization stage and the trigger envelope is received in real-time during operation. After step 605, step 610 includes receiving an angular position signal at the driver IC. The angular position signal may range from 0° to 720° and corresponds to the angular position of a mechanical system, such as a combustion engine for example, in various embodiments.

According to various embodiments, step 615 includes synchronizing a drive signal with the angular position signal. In such embodiments, the drive signal is based on the control scheme. In specific embodiments, the drive signal is generated based on a trigger envelope, a current profile, and an interpolated angular position signal. Following step 615, step 620 includes driving a power switch from the driver IC using the drive signal. The power switch may be a single power switch or multiple power switches. In some embodiments, the power switch is coupled to supply an actuation current to a solenoid actuator in the mechanical system. For example, the power switch supplies a fuel injector, pump, of valve in a combustion engine system. In other embodiments, numerous additional steps may be included in method 600 and the steps of method 600 may be rearranged in alternative embodiments.

FIG. 8 illustrates a schematic diagram of an example power stage topology 700 including analog driver front end 702, high side switch HSA, high side switch HSB, low side switch LSA, and low side switch LSB. According to various embodiments, analog driver front end 702 includes exemplary elements such as HS pre-drivers 1, 2, 3, 4, 5, and 6, LS pre-drivers 1, 2, 3, 4, 5, and 6, current monitoring circuits 1, 2, 3, and 4, and a VDS monitoring circuit. Analog driver front end 702 may correspond to drive circuit 120, driver circuit 270, or pre-driver circuit 412 described herein above in reference to FIGS. 2, 3, and 5, respectively. As shown, multiple instances and corresponding switches may be included. Power stage topology 700 shows two switch sets driven by HS/LS pre-drivers 1 and HS/LS pre-drivers 2, where each switch set may be coupled to a fuel injector for a different cylinder in a combustion engine, for example. Similarly, HS/LS pre-drivers 3 and HS/LS pre-drivers 4 may be coupled to respective switch sets (not shown) for each additional fuel injector for two additional cylinders. Thus, in one example, four cylinders with four fuel injectors each include a corresponding switch set (with high side and low side switches) driven by a corresponding HS and LS pre-drivers 1, 2, 3, and 4. In the specific example shown, current monitoring circuit 1 is coupled to shunt resistor $R_{SHUNT}$, in order to measure current flowing through high side switch HSA, high side switch HSB, low side switch LSA, and low side switch LSB.

HS/LS pre-drivers 5 and HS/LS pre-drivers 6 may be coupled to other components in an automotive system, such as valves, for example. Similarly, current monitoring circuits 2, 3, and 4 may be coupled to other switching sets or other components driven by analog driver front end 702. In various embodiments, current monitoring circuits 1, 2, 3, and 4 correspond to measurement circuit 122 or measurement circuit 272 described herein above in reference to FIGS. 2 and 3, respectively.

High side switch HSA and low side switch LSA are coupled to top and bottom terminals of inductive element LA. In various embodiments, inductive element LA is an actuator, such as a fuel injector for direct injection systems. High side switch HSA is also coupled to boost voltage VBOOST and low side switch LSA is also coupled to shunt resistor $R_{SHUNT}$. High side switch HSB and low side switch LSB are coupled to top and bottom terminals of inductive element LB. In various embodiments, inductive element LB is an actuator, such as a fuel injector for direct injection systems. High side switch HSB is also coupled to battery voltage VBAT and low side switch LSB is also coupled to shunt resistor $R_{SHUNT}$. Power stage topology 700 also includes capacitor CA coupled to a gate terminal of high side switch HSA, capacitor CB coupled to a gate terminal of high side switch HSB, and diodes D1, D2, D3, and D4.

Power stage topology 700 illustrates one type of exemplary power stage topology. According to various embodiments, embodiment driver ICs as described herein may be coupled to any type of switching topology as will be readily appreciated by those having skill in the art.

According to an embodiment, a controller system that is configured to drive a power switch includes a driver integrated circuit (IC), which includes an interface circuit, a synchronization circuit, and a drive circuit. The interface circuit is configured to receive a control scheme over a serial interface. The synchronization circuit is coupled to the interface circuit and is configured to receive an angular position signal and synchronize a drive signal with the angular position signal, where the drive signal is based on the control scheme. The drive circuit is coupled to the synchronization circuit and is configured to drive the power switch using the drive signal. Other embodiments include corresponding systems and apparatus, each configured to perform various embodiment methods.

In various embodiments, the controller system further includes a microcontroller coupled to the driver IC. The microcontroller is configured to provide the control scheme to the driver IC over the serial interface and provide the angular position signal to the driver IC. In some embodiments, the microcontroller is further configured to receive an initial angular position signal, generate the angular position signal based on the initial angular position signal, provide the angular position signal to the driver IC, and generate an interpolated angular position signal based on the angular position signal. The interpolated angular position signal has a higher resolution than the angular position signal.

In some further embodiments, the microcontroller is further configured to generate a predicted angular position signal based on the interpolated angular position signal and a control input. In further embodiments, the synchronization circuit includes a position determination circuit coupled to the interface circuit and configured to also generate the interpolated angular position signal based on the angular position signal, where the interpolated angular position signal has a higher resolution than the angular position signal. In such embodiments, the position determination circuit may be further configured to generate a predicted angular position signal based on the interpolated angular position signal and a control input.

In various embodiments, the angular position signal includes angular position information of a rotational machine. In such embodiments, the rotational machine may operate in cycles, each cycle including 720 degrees of rotation. In some embodiments, the rotational machine includes a combustion engine and the power switch supplies current to a solenoid in a fuel injector for the combustion engine.

In various embodiments, the driver IC further includes a measurement circuit configured to receive a measurement signal from the power switch and generate a feedback signal. In such embodiments, the driver IC may further include a timestamp circuit coupled to the measurement circuit and to the interface circuit, where the timestamp circuit is configured to provide the feedback signal and a corresponding timestamp to the interface circuit. In some embodiments, the synchronization circuit includes a position determination circuit coupled to the interface circuit and configured to generate an interpolated angular position signal based on the angular position signal, where the interpolated angular position signal has a higher resolution than the angular position signal.

In various embodiments, the interface circuit is configured to operate using a bidirectional high-speed synchronous serial communication interface protocol. In such embodiments, the interface circuit may include a high speed serial link (HSSL) interface circuit configured for serial communication over six external pins of the driver IC. In some embodiments, the driver IC further includes a phase locked loop (PLL) circuit coupled to the interface circuit. In further embodiments, the driver IC further includes a memory circuit including a volatile memory circuit. In other embodiments, the memory circuit may include a non-volatile lookup table memory in place of or in addition to the volatile memory circuit.

According to an embodiment, a method of operating a controller system includes receiving a control scheme over a serial interface at a driver IC, receiving an angular position signal at the driver IC, synchronizing a drive signal with the angular position signal, and driving a power switch from the driver IC using the drive signal. The drive signal is based on the control scheme. Other embodiments include corresponding systems and apparatus, each configured to perform various embodiment methods.

In various embodiments, the method further includes providing the control scheme to the driver IC over the serial interface from a microcontroller and providing the angular position signal to the driver IC from the microcontroller. In such embodiments, the method may further include receiving an initial angular position signal at the microcontroller, generating, in the microcontroller, the angular position signal based on the initial angular position signal, providing the angular position signal from the microcontroller to the driver IC, and generating, in the microcontroller, an interpolated angular position signal based on the angular position signal.

In such embodiments, the interpolated angular position signal has a higher resolution than the angular position signal.

In further embodiments, the method further includes generating, in the microcontroller, a predicted angular position signal based on the interpolated angular position signal and based on a control input. In other embodiments, synchronizing the drive signal with the angular position signal includes generating, in the driver IC, the interpolated angular position signal based on the angular position signal, and synchronizing the drive signal with the interpolated angular position signal. In such embodiments, the method may further include generating, in the driver IC, a predicted angular position signal based on the interpolated angular position signal and based on a control input.

In various embodiments, the method further includes receiving a measurement signal from the power switch, generating a feedback signal based on the measurement signal, and providing the feedback signal to the microcontroller. In such embodiments, the method may further include generating a corresponding timestamp signal for the feedback signal and providing the corresponding timestamp signal with the feedback signal to the microcontroller. In some embodiments, the angular position signal is received from a rotational machine that operates in cycles, each cycle including 720 degrees of rotation.

According to an embodiment, a controller system is configured to drive a power switch in a mechanical system with angular position information. The controller system includes a microcontroller circuit and a driver IC. The microcontroller circuit includes a first angular position input pin, an angular position output pin, a control input pin, and a first plurality of serial interface pins. Further, the microcontroller circuit is configured to generate an interpolated angular position signal based on the angular position information received at the first angular position input pin, provide an angular position signal through the angular position output pin, and provide a control scheme for the power switch through the first plurality of serial interface pins. The angular position signal is based on the angular position information received at the first angular position input pin and has a lower resolution than the interpolated angular position signal. The driver IC includes a second angular position input pin coupled to the angular position output pin, a second plurality of serial interface pins coupled to the first plurality of serial interface pins, and a drive pin configured to be coupled to the power switch. Further, the driver IC is configured to generate the interpolated angular position signal based on information received at the second angular position input pin, receive the control scheme at the second plurality of serial interface pins, generate a switching control signal based on the control scheme and the interpolated angular position signal, and provide a drive signal to the power switch at the drive pin based on the switching control signal. Other embodiments include corresponding systems and apparatus, each configured to perform various embodiment methods.

In various embodiments, the microcontroller circuit is further configured to generate a predicted angular position signal based on the interpolated angular position signal and a control input received from the control input pin. In such embodiments, the driver IC is further configured to generate the predicted angular position signal based on the interpolated angular position signal and further control information received at the second plurality of serial interface pins.

In various embodiments, the driver IC is further configured to provide a feedback signal and timestamp through the second plurality of serial interface pins. In such embodiments, the feedback signal and timestamp may be based on a condition of the power switch. In some embodiments, the mechanical system includes a rotational engine. In various such embodiments, the rotational engine may operate in engine cycles, each cycle including 720 degrees of rotation. In such embodiments, the power switch may drive a solenoid actuator during each cycle of the rotational engine. In further embodiments, the angular position information includes a first sensed angle signal from a crankshaft sensor in the rotational engine and a second sensed angle signal from a camshaft sensor in the rotational engine.

According to an embodiment, a driver IC is configured to drive a power switch in a mechanical system with angular position information. The driver IC includes a position determination circuit coupled to an angular position input of the driver IC, an interface circuit coupled to a plurality of serial interface inputs of the driver IC, a control circuit coupled to the interface circuit and the position determination circuit, a driver circuit coupled to the control circuit, and a timestamp circuit coupled to the control circuit and configured to be coupled to the power switch. The position determination circuit is configured to generate an interpolated angular position signal based on an angular position signal received from the angular position input, where the interpolated angular position signal has a higher resolution than the angular position signal. The control circuit is configured to generate a switching control signal. The driver circuit is configured to drive the power switch based on the switching control signal. The timestamp circuit is configured to provide a feedback measurement with a corresponding timestamp to the control circuit. Other embodiments include corresponding systems and apparatus, each configured to perform various embodiment methods.

In various embodiments, the position determination circuit is further configured to generate a predicted angular position signal based on the interpolated angular position signal and a control input. In some embodiments, the timestamp circuit includes a measurement and diagnostic circuit configured to generate the feedback measurement including measurement information from the power switch and diagnostic information and generate the corresponding timestamp.

In various embodiments, the driver IC further includes a memory circuit including a volatile SRAM. The memory circuit may also include a non-volatile lookup table in some embodiments. In some embodiments, the angular position input is coupled to one external pin of the driver IC and the plurality of serial interface inputs of the driver IC is coupled to six external pins of the driver IC. In further embodiments, the angular position signal has a resolution of 6 degrees and the interpolated angular position signal has a resolution of 0.5 degrees or finer.

Advantages of some embodiments may include precisely synchronized control based on angular position between a microcontroller and driver IC in a mechanical system with a component having angular position information. Some embodiments may have an advantage of reduced latency, more precise control of the driver IC, or reduced external pin connections between the microcontroller and the driver IC. Particular advantages of some embodiments may provide precise control of a fuel injector enabling better combustion and leading to lower emissions from the combustion process. Specific advantages may also include a reduced pin-count between microcontroller and driver IC that allows for a cost reduction of each component.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A controller system configured to drive a power switch, the controller system comprising:
a driver integrated circuit (IC) comprising:
an interface circuit configured to receive a control scheme over a serial interface,
a synchronization circuit coupled to the interface circuit and configured to
receive an angular position signal,
synchronize a drive signal with the angular position signal, wherein the drive signal is based on the control scheme, and
generate an interpolated angular position signal based on the angular position signal, wherein the interpolated angular position signal has a higher resolution than the angular position signal; and
a drive circuit coupled to the synchronization circuit and configured to drive the power switch using the drive signal.

2. The controller system of claim 1, further comprising a microcontroller coupled to the driver IC, the microcontroller configured to:
provide the control scheme to the driver IC over the serial interface; and
provide the angular position signal to the driver IC.

3. The controller system of claim 2, wherein the microcontroller is further configured to:
receive an initial angular position signal;
generate the angular position signal based on the initial angular position signal;
provide the angular position signal to the driver IC; and
also generate the interpolated angular position signal based on the angular position signal, wherein the interpolated angular position signal has a higher resolution than the angular position signal.

4. The controller system of claim 3, wherein the microcontroller is further configured to generate a predicted angular position signal based on the interpolated angular position signal and a control input.

5. The controller system of claim 3, wherein the synchronization circuit comprises a position determination circuit coupled to the interface circuit, wherein the position determination circuit is configured to generate the interpolated angular position signal.

6. The controller system of claim 5, wherein the position determination circuit is further configured to generate a predicted angular position signal based on the interpolated angular position signal and a control input.

7. The controller system of claim 1, wherein the angular position signal comprises angular position information of a rotational machine.

8. The controller system of claim 7, wherein the rotational machine operates in cycles, each cycle comprising 720 degrees of rotation.

9. The controller system of claim 7, wherein the rotational machine comprises a combustion engine and the power switch supplies current to a solenoid in a fuel injector for the combustion engine.

10. The controller system of claim 1, wherein the driver IC further comprises a measurement circuit configured to receive a measurement signal from the power switch and generate a feedback signal.

11. The controller system of claim 10, wherein the driver IC further comprises a timestamp circuit coupled to the measurement circuit and to the interface circuit, wherein the timestamp circuit is configured to provide the feedback signal and a corresponding timestamp to the interface circuit.

12. The controller system of claim 1, wherein the synchronization circuit comprises a position determination circuit coupled to the interface circuit, wherein the position determination circuit is configured to generate the interpolated angular position signal.

13. The controller system of claim 1, wherein the interface circuit is configured to operate using a bidirectional high-speed synchronous serial communication interface protocol.

14. The controller system of claim 13, wherein the interface circuit comprises a high speed serial link (HSSL) interface circuit configured for serial communication over six external pins of the driver IC.

15. The controller system of claim 1, wherein the driver IC further comprises a phase locked loop (PLL) circuit coupled to the interface circuit.

16. The controller system of claim 1, wherein the driver IC further comprises a memory circuit comprising a volatile memory circuit.

17. A method of operating a controller system, the method comprising:
receiving a control scheme over a serial interface at a driver integrated circuit (IC);
receiving an angular position signal at the driver IC;
generating an interpolated angular position signal based on the angular position signal, wherein the interpolated angular position signal has a higher resolution than the angular position signal;
synchronizing a drive signal with the angular position signal, wherein the drive signal is based on the control scheme; and
driving a power switch from the driver IC using the drive signal.

18. The method of claim 17, further comprising:
providing the control scheme to the driver IC over the serial interface from a microcontroller; and
providing the angular position signal to the driver IC from the microcontroller.

19. The method of claim 18, further comprising:
receiving an initial angular position signal at the microcontroller;
generating, in the microcontroller, the angular position signal based on the initial angular position signal; and
providing the angular position signal from the microcontroller to the driver IC, wherein the interpolated angular position signal is generated in the microcontroller.

20. The method of claim 19, further comprising generating, in the microcontroller, a predicted angular position signal based on the interpolated angular position signal and a control input.

21. The method of claim 17, wherein the interpolated angular position signal is generated in the driver IC.

22. The method of claim 21, further comprising generating, in the driver IC, a predicted angular position signal based on the interpolated angular position signal and a control input.

23. The method of claim 18, further comprising:
receiving a measurement signal from the power switch;

generating a feedback signal based on the measurement signal; and
providing the feedback signal to the microcontroller.

24. The method of claim 23, further comprising:
generating a corresponding timestamp signal for the feedback signal; and
providing the corresponding timestamp signal with the feedback signal to the microcontroller.

25. The method of claim 17, wherein the angular position signal is received from a rotational machine that operates in cycles, each cycle including 720 degrees of rotation.

26. A controller system configured to drive a power switch in a mechanical system with angular position information, the controller system comprising:
a microcontroller circuit comprising a first angular position input pin, an angular position output pin, a control input pin, and a first plurality of serial interface pins, wherein the microcontroller circuit is configured to:
generate an interpolated angular position signal based on the angular position information received at the first angular position input pin,
provide an angular position signal through the angular position output pin, wherein the angular position signal is based on the angular position information received at the first angular position input pin and has a lower resolution than the interpolated angular position signal, and
provide a control scheme for the power switch through the first plurality of serial interface pins; and
a driver integrated circuit (IC) comprising a second angular position input pin coupled to the angular position output pin, a second plurality of serial interface pins coupled to the first plurality of serial interface pins, and a drive pin configured to be coupled to the power switch, the driver IC configured to:
generate the interpolated angular position signal based on information received at the second angular position input pin,
receive the control scheme at the second plurality of serial interface pins,
generate a switching control signal based on the control scheme and the interpolated angular position signal, and
provide a drive signal to the power switch at the drive pin based on the switching control signal.

27. The controller system of claim 26, wherein:
the microcontroller circuit is further configured to generate a predicted angular position signal based on the interpolated angular position signal and a control input received from the control input pin; and
the driver IC is further configured to generate the predicted angular position signal based on the interpolated angular position signal and further control information received at the second plurality of serial interface pins.

28. The controller system of claim 26, wherein the driver IC is further configured to provide a feedback signal and timestamp through the second plurality of serial interface pins.

29. The controller system of claim 28, wherein the feedback signal and timestamp are based on a condition of the power switch.

30. The controller system of claim 26, wherein the mechanical system comprises a rotational engine.

31. The controller system of claim 30, wherein the rotational engine operates in engine cycles, each cycle including 720 degrees of rotation.

32. The controller system of claim 31, wherein the power switch drives a solenoid actuator during each cycle of the rotational engine.

33. The controller system of claim 30, wherein the angular position information comprises:
a first sensed angle signal from a crankshaft sensor in the rotational engine; and
a second sensed angle signal from a camshaft sensor in the rotational engine.

34. A driver integrated circuit (IC) configured to drive a power switch in a mechanical system with angular position information, the driver IC comprising:
a position determination circuit coupled to an angular position input of the driver IC and configured to generate an interpolated angular position signal based on an angular position signal received from the angular position input, wherein the interpolated angular position signal has a higher resolution than the angular position signal;
an interface circuit coupled to a plurality of serial interface inputs of the driver IC;
a control circuit coupled to the interface circuit and the position determination circuit, wherein the control circuit is configured to generate a switching control signal;
a driver circuit coupled to the control circuit and configured to drive the power switch based on the switching control signal; and
a timestamp circuit coupled to the control circuit and configured to be coupled to the power switch, wherein the timestamp circuit is configured to provide a feedback measurement with a corresponding timestamp to the control circuit.

35. The driver IC of claim 34, wherein the position determination circuit is further configured to generate a predicted angular position signal based on the interpolated angular position signal and a control input.

36. The driver IC of claim 34, wherein the timestamp circuit comprises a measurement and diagnostic circuit configured to:
generate the feedback measurement including measurement information from the power switch and diagnostic information; and
generate the corresponding timestamp.

37. The driver IC of claim 34, further comprising a memory circuit comprising a volatile SRAM and a nonvolatile lookup table.

38. The driver IC of claim 34, wherein
the angular position input is coupled to one external pin of the driver IC; and
the plurality of serial interface inputs of the driver IC is coupled to six external pins of the driver IC.

39. The driver IC of claim 34, wherein the angular position signal has a resolution of 6 degrees and the interpolated angular position signal has a resolution of 0.5 degrees or finer.

40. A controller system configured to drive a power switch, the controller system comprising:
a driver integrated circuit (IC) comprising:
an interface circuit configured to receive a control scheme over a serial interface, the control scheme comprising a trigger envelope and a current profile,
a synchronization circuit coupled to the interface circuit and configured to
receive an angular position signal, and synchronize a drive signal with the angular position signal according to the trigger envelope and current profile of the control scheme, and a drive circuit coupled to the synchronization circuit and configured to drive the power switch using the drive signal, wherein the drive signal is configured to produce the current profile in the power switch.

41. The controller system of claim 40, further comprising a memory circuit coupled to the interface circuit and the synchronization circuit, wherein the interface circuit is configured to store the control scheme in the memory circuit, and the synchronization circuit is configured to retrieve the control scheme from the memory circuit.

\* \* \* \* \*